Figure 1:
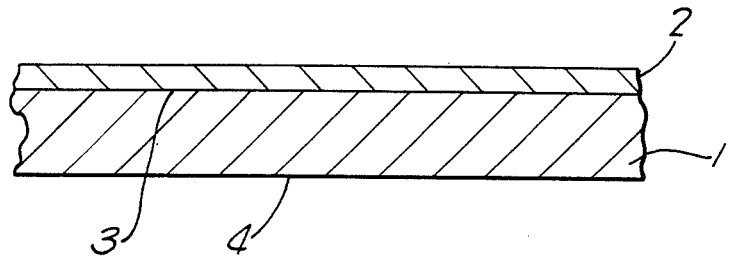

United States Patent [19]

Crocker

[11] Patent Number: 4,728,561
[45] Date of Patent: Mar. 1, 1988

[54] SHAPED ARTICLE FORMED FROM A COATED POLYARYL ETHER

[75] Inventor: Christopher Crocker, Bolton, England

[73] Assignee: Imperial Chemical Industries PLC, London, England

[21] Appl. No.: 801,911

[22] Filed: Nov. 26, 1985

[30] Foreign Application Priority Data

Nov. 26, 1984 [GB] United Kingdom ............. 8429771

[51] Int. Cl.⁴ .................... B32B 27/08; G03C 1/78
[52] U.S. Cl. ............................... 428/207; 428/419;
428/458; 428/483; 428/524; 428/199; 428/910;
427/412.1; 430/97
[58] Field of Search ............. 428/483, 419, 458, 910,
428/207, 524, 199

[56] References Cited

U.S. PATENT DOCUMENTS

| | | | |
|---|---|---|---|
| 3,850,642 | 11/1974 | Bailey, Jr. et al. | 430/528 |
| 4,302,505 | 11/1981 | Heberger | 428/483 |
| 4,588,623 | 5/1986 | Hartsing, Jr. et al. | 428/416 X |

FOREIGN PATENT DOCUMENTS 58-196252 of 1983 Japan .
1589926 5/1981 United Kingdom .

*Primary Examiner*—P. C. Ives
*Attorney, Agent, or Firm*—Cushman, Darby & Cushman

[57] ABSTRACT

A shaped article formed from a polyarylether is coated on at least part of one surface thereof with a polyester resin containing free sulphonate groups. The polyarylether can be a polyarylether-sulphone or a polyaryletherketone such as polyaryletheretherketone. The shaped article can be a sheet or a film. The coated article may have further coatings applied, for example the coated article may be metallized.

14 Claims, 3 Drawing Figures

SHAPED ARTICLE FORMED FROM A COATED POLYARYL ETHER

The present invention relates to shaped articles formed from polymeric materials and having a coating thereon.

Polymeric materials are now extensively used for the production of shaped articles and in recent years polymers have become available which have high melting or softening points which make articles formed from such polymers suitable for use at higher temperatures than are attainable using the longer established polymeric materials. Polyarylether derivatives such as polyarylethersulphones and polyaryletherketones are examples of such polymers which, in addition to having high service temperatures have other desirable properties such as electrical insulation characteristics. Polyaryletherketones have good electrical insulating properties and high melting or softening temperatures and some polymers of this type can be used as an electrical insulator continuously at temperatures in excess of 200° C. for example up to about 250° C. These properties of polyarylethers make them suitable for use as substrates for metal coatings, for example in the electronics industry. In applying a metal coating to the polymer, it is usually necessary either to chemically treat the surface of the polymer or to coat the surface of the polymer with a material which forms an adherent layer. Techniques of coating polyarylethers, particularly polyaryletherketones, have not been entirely satisfactory in that the metal coating has shown only moderate adhesion and an improved adhesion is desirable.

According to the present invention there is provided a shaped article formed from a polyarylether and coated on at least part of one surface thereof with a polyester resin containing free sulphonate groups.

The shaped article may be of any suitable form and, in particular, may be a sheet or film which may be an unoriented, film or a monoaxially or biaxially oriented film.

The polyarylether may be one in which at least some of the aryl groups are separated by sulphone or ketone groups as in the polyarylethersulphones or polyaryletherketones.

If the polyarylether is a polyarylethersulphone, it may be a polymer which contains the repeat units $$-(Ph-O-Ph-SO_2)-\qquad I$$

alone or in conjunction with other repeat units where
Ph represents a phenylene residue, preferably a paraphenylene residue.

If the polyarylether is a polyaryletherketone, it may be a polymer which contains the repeat units.

$$-(Ph-O-Ph-CO-Ph-O)-\qquad II$$

or the repeat units $$-(Ph-O-Ph-CO)-\qquad III$$

alone or in conjunction with each other and/or in conjunction with other repeat units, where Ph is as defined.

The other repeat units which may be present in the polyarylether are typically of the general formula $$-(Ph-A-Ph-O)-\qquad IV$$

where
Ph is as defined,
A is a direct link, a sulphur atom, a divalent hydrocarbon radical or a group $$-Q-(Ar-Q^1)_{\overline{n}}-$$

in which
$Q_1$ is $-CO-$, $-SO_2-$ or $-O-$;
Q is $-CO-$, $-SO_2-$ or $-O-$;
Ar is a divalent aromatic radical; and
n is 0, 1, 2 or 3.

In the formula IV, if the group A is a divalent hydrocarbon radical it is typically a phenylene residue or a dimethylmethylene group ($-C(CH_3)_2-$). The aromatic radical Ar is preferably a divalent aromatic radical selected from phenylene, biphenylylene or terphenylylene.

Polyarylethersulphone polymers which may be used include polymers containing repeat unit I only or polymers having alternating repeat units I and IV wherein, in the repeat units IV, the group A is a dimethylmethylene group. An alternative polyarylethersulphone polymer which may be used contains the repeat unit I and the repeat unit IV wherein the group A is $-Q-(Ar-Q')_n$ in which Ar is a paraphenylene group, Q is an oxygen atom, Q' is a $-SO_2-$ group and n is one. The polyarylethersulphone polymers are preferably materials having a molecular weight such that the reduced viscosity (RV) of the polymer, measured as a 1% by weight solution of the polymer in dimethylformamide at 25° C., is at least 0.2 and preferably at least 0.4. The polymer may be such as to give an RV of up to 2.5, but it is generally preferred that the RV of the polymer does not exceed 2.0.

We prefer that when the polyarylether is a polyaryletherketone, it is crystalline polymer containing the repeat units II, in which each Ph is a para-phenylene residue. Especially preferred are such polymers which are tough and have an inherent viscosity of at least 0.7, as is described in more detail in our European Patent Publication No. 001 879. Alternatively, a polyaryletherketone containing the repeat units II together with repeat units of the formula $$-(Ph-Ph-O-Ph-CO-Ph-O)-\qquad V$$

may be used, such copolymers being described in more detail in our copending British patent application No. 8430669 filed on 5 Dec. 1984 and entitled "Thermoplastic Aromatic Polyetherketones". Inherent viscosity of polyaryletherketones is measured at 25° C. on a solution of the polymer in concentrated sulphuric acid of density 1.84 g cm$^{-3}$, said solution containing 0.1 g of polymer per 100 cm$^3$ of solution. As an alternative to inherent viscosity, an indication of the average molecular weight of the polyaryletherketone may be obtained by measuring the melt viscosity of the polymer. Preferred polymers have a melt viscosity of at least 0.1 KNs/m$^2$, which corresponds approximately to an inherent viscosity of 0.7. The melt viscosity is measured using a ram extruder fitted with a 3.175×0.5 mm die and operating at 400° C. and a sheer rate of 1000s.

The polyarylether is preferably in the form of a sheet or film. Sheet or film can be obtained from the polyarylether using known techniques such as extruding the polymer through a slot die and, if desired, passing the extrudate over rolls to cool it and to provide a desired surface finish on the extrudate. The extrudate may be rapidly chilled to prevent crystallisation of those polyarylethers, particularly the polyaryletherketones, which are crystallisable, or may be heat treated to induce crystallisation. The film may also be stretched in one or more directions to produce mono- or bi-axially oriented film. The production of oriented films from polyaryletherketones is described in Research Disclosure 20216 of February 1981 and, in more detail, in Research Disclosure 21601 of April 1982 and the techniques described therein may be used to produce films which are suitable for use as the shaped articles to be coated in accordance with the present invention.

The polyester resin which is coated onto the polyarylether is one containing free sulphonate groups, by which is meant a group of formula —SO$_3$R, wherein R is hydrogen, ammonium, substituted ammonium, or an alkali metal, such as lithium, sodium or potassium, which sulphonate groups do not participate in the condensation or ester-interchange reaction by which the polyester resin is formed. For convenience this polyester resin will be referred to as the "sulphonated polyester".

Formation of the sulphonated polyester is conveniently effected in known manner by condensation, or ester-interchange, at temperatures of up to 275° C., and in the presence of a catalyst, of at least one sulphonated polycarboxylic acid, preferably a dicarboxylic acid, or an anhydride or lower alkyl (up to ten carbon atoms in the alkyl group, preferably methyl) ester thereof with at least one polyhydric alcohol. Preferably, the reaction is effected in the presence of at least one unsulphonated polycarboxylic acid, preferably a dicarboxylic acid, or an anhydride or lower alkyl ester thereof, such that the sulphonated polycarboxylic acid comprises up to 35 mole%, and preferably from 5 to 25 mole%, of the total content of polycarboxylic acids in the sulphonated polyester. A suitable method for the preparation of the sulphonated polyester is disclosed in U.S. Pat. No. 3,734,874.

Suitable sulphonated polycarboxylic acids for incorporation into the sulphonated polyester include the ammonium and alkali metal, particularly sodium, salts of 4-sulphophthalic acid, 5-sulphoisophthalic acid and sulphoterephthalic acid, or the said anhydrides or lower alkyl esters thereof.

Unsulphonated polycarboxylic acids suitable for incorporation into the sulphonated polyester include phthalic acid, isophthalic acid, terephthalic acid, cyclohexane-1,4-dicarboxylic acid, adipic acid, sebacic acid, trimellitic acid and itaconic acid, or the acid anhydrides or lower alkyl esters thereof.

Suitable polyhydric alcohols for incorporation into the sulphonated polyester include ethylene glycol, 1,2-propylene glycol, diethylene glycol, neopentyl glycol, cyclohexane-1,4-dimethanol and 1,3-propane-diol.

If desired, the sulphonated polyester may be modified by the inclusion therein of one or more monohydric alcohols, such as ethylene glycol monobutyl ether, benzyl alcohol and cyclohexanol.

A preferred sulphonated polyester comprises isophthalic acid, diethylene glycol and sulphoisophthalic acid or sulphoterephthalic acid.

The coating of sulphonated polyester may, in turn, be coated with a further material, for example printing inks, a photographic emulsion, or a metallic coating.

Thus, as a further aspect of the present invention there is provided a shaped article formed from a polyarylether and coated on at least part of one surface thereof with a sulphonated polyester (as herein defined) wherein a further material is coated onto the sulphonated polyester.

When the shaped article is a film, it is preferred that at least one surface thereof has a coating of the sulphonated polyester and that at least one coated surface is provided with a further and different coating, preferably a metallic coating, on the sulphonated polyester.

The present invention also provides a method of forming a coated article wherein a shaped article formed from a polyarylether is coated by applying to at least part of one surface thereof a sulphonated polyester and, optionally, thereafter applying a layer of a further and different material to a surface which has been coated with the sulphonated polyester.

Polymeric materials such as polymeric films are generally liable to accumulate static charges by frictional contact with metals or with rubber. This charge accumulation can create difficulties in the handling, conversion and fabrication of shaped articles such as films. These difficulties include dust attraction and clinging of film to rollers. Dust attraction can lead to formation of pimples in film wound onto a reel and these affect reel quality and create local areas of high pressure which cause the film to stick during unwinding from the reel.

To overcome such difficulties, the coefficient of friction of the shaped article may be reduced, thereby reducing the tendency of the article to accumulate static charges. Such a reduction in the coefficient of friction may be obtained by incorporating into the shaped article an inorganic particulate filler such as silica, of relatively large particle size, for example having a number averagemean diameter of about one micrometer. However, such fillers increase film haziness, which can be detrimental to the brightness of a subsequently deposited metallic layer. Furthermore, the presence of relatively large particle size fillers tends to increase the surface roughness of the shaped article and this can be undesirable for certain applications, for example magnetic recording media. Alternatively, the tendency of the coated article to acquire a static charge may bereduced by incorporating a triboelectric charge control agent into the sulphonated polyester. This agent should be capable of producing a charge which is opposite to that produced by the sulphonated polyester, which typically produces a positive charge.

By a "triboelectric charge control agent" is meant a material of known triboelectric charging propensity which may be incorporated into or associated with a surface to adjust the triboelectric characteristics thereof. Such agents, which can be used to minimise, maximise, or adjust to a prescribed level, the tendency of a given surface to generate static electrical charges when contacted with another, usually dissimilar, surface, have been proposed for use in the photographic art. For example, a variety of triboelectric charge control agents is disclosed in U.S. Pat. No. 3,850,642 for use in radiation sensitive elements, such as X-ray and aerofilm materials. These agents include (a) compounds containing a partially or completely fluorinated chain, for example, a fluorinated surfactant of formula $C_8F_{17}SO_2NH(CH_2)_3N(CH_3)_2$, (b) the sodium or potassium salts of substituted benzene sulphonic acids, (c) multifunctional carboxylic acids, such as citric, tartaric, and succinic acids, (d) carboxylated polymers in the free carboxyl form, (e) lower alkyl phosphates, and (f) repetitively halogen-, nitro- and hydroxyl-substituted polymers.

U.S. Pat. Nos. 3,754,924; 3,884,699 and 4,292,402 all disclose photographic materials which incorporated fluorinated surfactants. Such materials may be used as triboelectric charge control agents in coated articles in accordance with the present invention. In the non-photographic products included within the present invention, acceptable behaviour can be achieved by employing a triboelectric charge control agent of the kind which is capable of acquiring a negative charge on contact with a metal such as chromium plated steel. It is particularly advantageous if the charge control agent is surface active since then only a small quantity, based on the weight of the sulphonated polyester, is required, with minimal effect on the other properties of the coated article, for example in the case of film, adhesion to metal, slip, antiblocking etc. Fluorinated surfactants of the kind disclosed in the aforementioned U.S. patents have been found to be particularly effective in coated articles, especially coated films, in accordance with the invention. The preferred surfactants are anionic, non-ionic or amphoteric in nature; cationic materials tend to destabilise the aqueous sulphonated polyester medium. Anionic or nonionic fluorosurfactants, or mixtures thereof, are particularly preferred. The amount of charge control agent required to give a low rate of charge-up is generally in the range of from 0.1 to 10% by weight of the sulphonated polyester.

If desired, and preferably, the sulphonated polyester may be cross-linked to improve its durability, hardness, cohesive strength and adhesion to the polyarylether and to provide resistance to attack by solvents. Cross-linking may be promoted by the incorporation of any cross-linking agent known to be effective in polyesters. Suitable cross-linking agents include the condensation products of an amine with an aldehyde, for example, melamine, diazine, urea, cyclic ethylene urea, cyclic propylene urea, thiourea, cyclic ethylene thiourea, an alkyl melamine, such as butyl melamine, an aryl melamine, a guanamine, an alkylguanamine, an aryl guanamine, a benzoguanamine, or glycoluril, maybe condensed with an aldehyde, such as formaldehyde. The condensation product is preferably alkoxylated, e.g. ethoxylated. A preferred cross-linking agent is a methylated melamine-formaldehyde resin.

The amount of cross-linking agent necessary to promote the required degree of cross-linking will depend, inter alia, on the sulphonated polycarboxylic acid used in the production of the sulphonated polyester, and may be readily determined by simple experimentation. In general, the cross-linking agent suitably comprises up to 25%, and preferably from 2 to 20%, by weight of the sulphonated polycarboxylic acid component of the sulphonated polyester.

Acceleration of the cross-linking may be effected, if desired, by adding a suitable catalyst to the sulphonated polyester. Preferred catalysts for use with an amine-formaldehyde cross-linking agent are ammonium chloride, ammonium nitrate, and the ammonium salts of phosphoric acid, citric acid, p-toluene sulphonic acid or p-dodecylbenzenesulphonic acid.

The sulphonated polyester is conveniently applied to the polyarylether substrate in the form of an aqueous solution or dispersion. Application from an aqueous medium is economically advantageous, avoids the potential explosive and toxicity hazards associated with the use of volatile organic solvents, and eliminates the problem of residual odour frequently encountered when an organic solvent is employed. A polyester resin with a relatively high sulphonate group content can generally be dispersed in hot water alone. However, if the polyester resin is insufficiently polar to disperse or dissolve unaided, dispersion can be accomplished by incorporation of a suitable surfactant. It may be advantageous to dissolve the polyester in a small amount of an organic solvent prior to dispersion in water.

To achieve good wetting and levelling properties of the aqueous resin medium on a polyarylether substrate, it is necessary that the surface energy of the aqueous resin medium is less than that of the polyarylether substrate. For example, for application to a polyarylethersulphone film substrate, the surface tension of the aqueous resin medium should be less than about 40 dyne cm$^{-1}$. In general, the use of a fluorinated surfactant as the triboeletric charge control agent, as hereinbefore described, will reduce the surface tension of the resin medium by the required amount. Thus, the charge control agent will also act as a wetting agent. In cases where reduction in surface tension is insufficient to promote good wetting, a suitable, independent surfactant may be added to the aqueous resin medium. To ensure compatability with the sulphonated polyester, it is preferred to employ a surfactant of an anionic, non-ionic or amphoteric character. Suitable surfactants include alkylbenzene sulphonates, sodium alkyl sulphosuccinates, alcohol ethoxylates, and ethoxylated alkyl, e.g. nonyl, phenols.

Deposition of the aqueous solution or dispersion of the sulphonated polyester onto the surface of the polyarylether shaped article may be effected by conventional coating techniques, for example, when the shaped article is a sheet or film, by gravure roll coating, reverse roll coating, dip coating, bead coating, slot coating or electrostatic spray coating. The solution or dispersion is suitably applied in an amount such that the thickness of the sulphonated polyester layer when dried, for example by heating the coated substrate, will provide an effective bond to any subsequently applied different layer. Conveniently, the thickness of the dried, sulphonated polyester layer is of the order of one micrometer, or less, and preferably in a range of from 10 to 1000 nanometers (nm).

If the shaped article is a film, it may be unoriented, or unaxially oriented, but is preferably biaxially oriented by drawing in two mututally perpendicular directions in the plane of the film to achieve a satisfactory combination of mechanical and physical properties. Simultaneous biaxial orientation may be effected by extruding a thermoplastics polymeric tube which is subsequently quenched, reheated and then expanded by internal gas pressure to induce transverse orientation, and withdrawn at a rate which will induce longitudinal orientation. In such a simultaneous stretching process, the sulphonated polyester is suitably coated onto the polyarylether substrate either before commencement or after conclusion of the stretching operation. However, since some polyarylethers, for example polymers of the repeat unit II, or the repeat unit III, are processed at high temperatures, to avoid any possible deterioration of the sulphonated polyester coating during such high temperature processing, it is preferred that the coating step is effected after all such high temperature heat treatment stages have been effected on such films. Sequential stretching may be effected in a stenter process by extruding the polyarylether as a flat extrudate which is subsequently stretched first in one direction and then in the other mutually perpendicular direction. Generally, it is preferred to stretch firstly in the longitudinal direction, i.e. the forward direction through the film stretching machine, and then in the transverse direction. A stretched film may be, and preferably is, dimensionally stabilised by heat-setting under dimensional restraint at a temperature above the glass transition temperature of the polyarylether but below the melting temperature thereof, when the polyarylether is a crystalline polymer such as a polyaryletherketone. Many polyarylethersulphones are amorphous and it will be realised that films formed from such polymers cannot be heat set.

The sulphonated polyester is preferably coated onto an already oriented film. However, although not preferred, application of the coating medium can be effected before or during the stretching operation. Thus, the sulphonated polyester can be coated onto the film between the two stages (longitudinal and transverse) of a biaxial stretching operation. Such a sequence of stretching and coating can be effected by first stretching a film in the longitudinal direction over a series of rotating rollers, coating the stretched film with the sulphonated polyester and then stretching transversely in a stenter oven, preferably followed by heat-setting.

Prior to deposition of the sulphonated polyester resin onto the surface of the polyarylether, the surface may, if desired, be subjected to a chemical or physical surface-modifying treatment to improve the bond between that surface and the subsequently applied sulphonated polyester. One such treatment is to subject the exposed surface of the polyarylether to a high voltage electrical stress accompanied by corona discharge.

A coating of the sulphonated polyester may be applied to one or each surface of the polyarylether and one or each coating of the sulphonated polyester may be subsequently coated with a different coating material, particularly a metal coating. Alternatively, at least one surface of the polyarylether shaped article may be uncoated, or may be coated with a layer of a material other than the sulphonated polyester. For example, a pressure sensitive adhesive layer may be deposited on an uncoated surface of the polyarylether shaped article.

Deposition of a metallic layer onto the, or each, coating of the sulphonated polyester may be effected by conventional metallising techniques for example, by laminating a preformed metallic foil to the sulphonated polyester, by deposition from a suspension of finely divided metallic particles in a suitable liquid vehicle, or preferably, by a vacuum deposition process in which a metal is evaporated or sputtered onto the sulphonated polyester in a chamber maintained under conditions of high vacuum. Suitable metals include palladium, nickel, copper (and alloys thereof, such as bronze), silver, gold, cobalt, zinc, and aluminium, but for electronic applications metals of good electrical conductivity are preferred, particularly copper.

Metallising may be effected over the entire exposed surface of the sulphonated polyester or over only selected portions thereof, as desired.

Metallised films, which are a preferred embodiment of the present invention, may be prepared in a range of thicknesses governed primarily by the ultimate application for which a particular film is to be employed. Films having a total thickness in a range extending from 2.5 to 250 microns are of general utility. However, for some applications it may be preferred to use a sheet, the thickness of which may be in excess of one mm.

The ratio of polyarylether to sulphonated polyester thickness may vary within a wide range, although the thickness of the sulphonated polyester preferably should not be greater than 10% of that of the polyarylether. In practice, the thickness of the sulphonated polyester layer is desirably at least 0.01 micrometer and preferably should not greatly exceed about 1.0 micrometer. If a metallic layer is provided on the sulphonated polyester, this metallic layer is conveniently deposited in a thickness from monoatomic proportions to about 50 micrometers or greater, although a preferred range is from 0.005 to 15.0 micrometers, and particularly from 0.01 to 1.0 micrometers. Other additional coating layers may be applied to the sulphonated polyester coating as desired, and the thickness of such other coating layers will be those appropriate to the function to be performed by such a coating, as for example a photographic emulsion.

The polyarylether and/or the sulphonated polyester used in a coated article according to the invention may conveniently contain any of the additives conventionally employed in the manufacture of thermoplastics polymeric films. Thus, agents such as dyes, pigments, voiding agents, lubricants, anti-oxidants, anti-blocking agents, surface active agents, slip aids, gloss-improvers, prodegradants, ultra-violet light stabilisers, viscosity modifiers and dispersion stabilisers may be incorporated in the polyarylether and/or the sulphonated polyester coating, as appropriate. In particular, the sulphonated polyester, and optionally the polyarylether, may contain a particulate filler such as silica, preferably, but not necessarily, of small particle size. Desirably, a filler, if employed in the sulphonated polyester layer, should be present in an amount not exceeding 50% by weight of the sulphonated polyester, and the mean particle size thereof preferably should not exceed 0.5, preferably less than 0.3, and especially from 0.005 to 0.2 micrometers. If a filler is employed in the polyarylether layer, this may be present in an amount of up to 40% by weight of the polyarylether but preferably does not exceed 0.5% by weight when the polyarylether is in the form of an oriented film. The mean particle size of the filler in the polyarylether may be in the range up to 5 micrometers but preferably does not exceed 0.3 micrometers and especially does not exceed 0.05 micrometers if it is desirable to avoid surface roughness in the shaped article.

Decorative and/or descriptive matter may be applied to the coated shaped articles of the invention by conventional printing techniques, for example by printing an inked pattern directly onto the, or a, coated surface of the shaped article and, optionally, protecting the printed matter by a layer of a protective lacquer. Alternatively, reverse printing techniques may be employed whereby the printed matter is embedded in the coated article at an interlayer position.

Coated articles according to the invention, particularly metallised films, are of utility in a wide range of applications including reflective screens, mirrors, solar panels, and especially electrical circuit boards, capacitors and magnetic recording media.

The invention is illustrated by reference to the accompanying drawings in which

Figure 2:
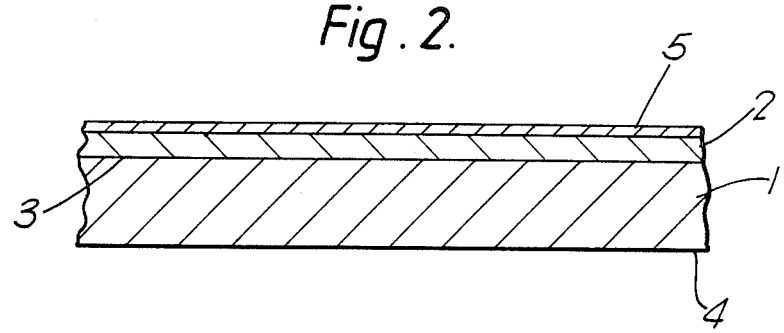
Figure 3:
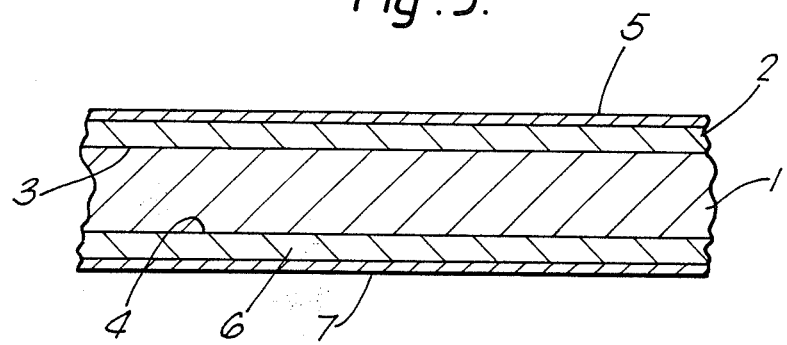

FIG. 1 is a schematic sectional elevation, not to scale, of a polyarylether film having a single coated layer, FIG. 2 is a similar schematic elevation of a polyarylether film having respectively a metallic and a sulphonated polyester layer, and FIG. 3 is a similar schematic elevation of a polyarylether film metallised on both opposed surfaces.

Referring to FIG. 1 of the drawings, the film comprises a polyarylether layer 1 having a layer 2 of a sulphonated polyester resin composition according to the invention bonded to one surface 3 thereof. Surface 4 of the polyarylether, remote from layer 2, is uncoated.

The film of FIG. 2 additionally comprises a metallic layer 5 bonded to the sulphonated polyester layer 2.

The film of FIG. 3 further comprises a second metallic layer 7 bonded to a layer 6 of a sulphonated polyester, layer 6 in turn being directly bonded to surface 4.

The invention is further illustrated by reference to the following Examples.

EXAMPLE 1

Polyarylethersulphone ('Victrex' (Registered Trade Mark) PES aromatic polymer 4100 G grade, obtained from Imperial Chemical Industries PLC) was formed into film using a two inch (5 cm) extruder fitted with a slot die and operating at a temperature of 360° C. The extruded film was drawn off over rollers.

The film obtained was 100 micrometers in thickness and was coated on one surface with the following coating composition:

| | |
|---|---|
| Eastman WD Size | 33 ml |
| (aqueous dispersion comprising 30% by weight of a polyester of isophthalic acid, diethylene glycol and a sulpho derivative of a dicarboxylic acid possibly sodium 5-sulphoisophthalate or sodium sulphoterephthalate): | |
| 'Cymel" 300 (hexamethoxymethylmelamine) as a 10% w/v aqueous solution: | 5 ml |
| Ammonium salt of p-toluenesulphonic acid, 10% w/v aqueous solution: | 4 ml |
| 'Surflon' S 141 (nonionic fluorinated surfactant, manufactured by Asahi Glass Co, Japan; | |
| 30% w/v solution in water/isopropanol): | 1.3 ml |
| Water: | to 500 ml |

The coated film was then dried at 160° C. for a time of 5 minutes. The thickness of the dry resin coating was 0.24 micrometers.

EXAMPLE 2

Aluminium was deposited under vacuum onto the sulphonated polyester coated surface of samples of the film of Example 1. The deposition was effected using an Edwards E306A coating unit ("bell-jar" metalliser). The metal was deposited at a pressure of $10^{-4}$–$10^{-5}$ mbar, and the samples produced had a circular area of metallising ca 20 cm in diameter. The amount of metal deposited in each case was controlled as far as possible, to yield a metallised film having a target O.D. (optical density) of about 2.5 (metal thickness about 45 nm). No surface pre-cleaning was used, and the substrate was not cooled.

To test the adhesion of the deposited metal, samples of the metallised film were heat-sealed i.e. the metal layer was sealed to a dry adhesive film tape. The seal was achieved using a 'Sentinel' heat-sealer operating at a jaw temperature of 105° C., dwell time of 1 second, and jaw pressure of 50 psi (3.5 kgcm$^{-2}$). This produced a seal 25 mm wide across the sample.

Peel specimens were prepared by cutting 25 mm wide strips at right angles to the seal, giving a sealed area of 25 mm by 25 mm on each sample, with an unsealed 'tail' at least 100 mm long. Five such specimens were cut from each sealed metallised sample, and the adhesion was measured by peeling apart each specimen using an 'Instron' Tensometer at a peel speed of 200 mm/min. The peel load (g/25 mm) was recorded for each specimen and the amount of aluminium transferred to the dry adhesive tape was visually assessed in each case. The results are set out in the following Table.

COMPARATIVE EXAMPLE A

The procedure of Example 2 was repeated with the exception that the film was the cast polyarylethersulphone obtained as described in Example 1 but which had not been subjected to a subsequent coating treatment.

EXAMPLE 3

Polyaryletherkteone ('Victrex' (Registered Trade Mark) PEEK aromatic polymer 450G grade, obtainable from Imperial Chemical Industries PLC) was formed into film using the general procedure of Example 1 but using a one inch (2.5 cm) extruder operating at a temperature of 380° C. The extruded film was drawn off over a cooled drum.

The amorphous cast film thus obtained was stretched by about 2.3 times its original dimensions at about 150° C. using forward draw rollers and then by about 2.8 times in the perpendicular direction at about 155° C. using a stenter. The film was heat set by passing, under tension, through an air oven at 220° C. for 30 seconds.

The resulting biaxially oriented film, which had a thickness of 23 micrometers, was then coated with the formulation used in Example 1. The coated film was dried at 160° C. for a time of 5 minutes. The thickness of the dry resin coating was 0.24 micrometers.

EXAMPLE 4

The coated film of Example 3 was metallised with aluminium as described in Example 2. The results of tests on the metallised film are set out in the following Table.

COMPARATIVE EXAMPLE B

The procedure of Example 4 was repeated with the exception that the film was the biaxially oriented polyaryletherketone film obtained as described in Example 3 but which had not been subjected to a subsequent coating treatment.

TABLE

| Example or Comp. Example | Mean peel strength (g/25 mm) | Aluminium removed (%) |
|---|---|---|
| 2 | >1000 | 0 |
| A | 10 | 90 |
| 4 | >1000 | 90 |
| B | 23 | 95 |

The superior peel strength of metallised films including a sulphonated polyester layer compared with films without a sulphonated polyester layer is evident from the foregoing results.

What is claimed is:

1. A shaped article consisting essentially of a polyarylether in which at least some of the aryl groups are separated by ketone-groups or which contains the repeat units —Ph—O—Ph—SO$_2$— alone or in conjunction with other repeat units of the general formula (Ph—A—Ph—O)

where
Ph is phenylene
A is a direct link, a sulphur atom, a divalent hydrocarbon radical or a group —Q—(Ar—Q$^1$)$_n$ in which
Q$_1$ is —CO—, —SO$_2$— or —O—;
Q is —CO—, —SO$_2$— or —O—;
Ar is a divalent aromatic radical; and
n is 0, 1, 2 or 3;
said shaped article having on at least a part of one surface a coating of polyester resin containing free sulphonate groups.

2. The shaped article of claim 1 wherein the sulphonated polyester is the product of isophthalic acid, diethylene glycol and either sulphoisophthalic acid or sulphoterephthalic acid.

3. The shaped article of claim 1 having a further material which is a printing ink, a photographic emulsion or a metallic coating coated onto the sulphonated polyester.

4. The shaped article of claim 3 having a metal coated onto the sulphonated polyester.

5. The shaped article of claim 1 wherein the sulphonated polyester contains a triboelectric charge control agent.

6. The shaped article of claim 1 which is the form of a sheet or film.

7. A shaped article according to claim 1 in which in the coating the polyester resin is cross-linked.

8. A shaped article according to claim 7 in which in the coating the polyester resin is cross-linked by an amine/aldehyde condensation product.

9. A shaped article according to claim 1 in which group A is phenylene or dimethylmethylene.

10. A shaped article consisting essentially of a polyarylether which contains either the repeat units —Ph—O—Ph—CO—Ph—O— or the repeat units

—Ph—O—Ph—CO— alone, or in conjunction with each other, and/or in conjunction with other repeat units of the general formula (Ph—A—Ph—O)

where
Ph is phenylene;
A is a direct link, a sulphur atom, a divalent hydrocarbon radical or a group —Q—(Ar—Q$^1$)$_n$ in which
Q is —CO—, —SO$_2$— or —O—;
Q$^1$ is —CO—, —SO$_2$— or —O—;
Ar is a divalent aromatic radical; and
n is 0, 1, 2 or 3;
said shaped article having on at least a part of one surface a coating of polyester resin containing free sulphonate groups.

11. A shaped article according to claim 10 in which group A is phenylene or dimethylmethylene.

12. A shaped article according to claim 6 in which in the coating the polyester resin is cross-linked by an amine/aldehyde condensation product.

13. A shaped article according to claim 10 in which in the coating the polyester resin is cross-linked.

14. A shaped article according to claim 10 which is a coated film to which the coating has been applied after heat treatment stages have been effected on the film.

* * * * *